(12) United States Patent
Numata et al.

(10) Patent No.: US 7,438,481 B2
(45) Date of Patent: Oct. 21, 2008

(54) OPTICAL SEMICONDUCTOR MODULE AND SEMICONDUCTOR DEVICE INCLUDING THE SAME

(75) Inventors: Hideo Numata, Yokohama (JP); Chiaki Takubo, Tokyo (JP); Hideto Furuyama, Yokohama (JP); Hiroshi Hamasaki, Hiratsuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/200,045

(22) Filed: Aug. 10, 2005

(65) Prior Publication Data
US 2006/0045434 A1    Mar. 2, 2006

(30) Foreign Application Priority Data
Aug. 10, 2004    (JP) ............................ P2004-233749

(51) Int. Cl.
*G02B 6/30* (2006.01)
*G02B 6/36* (2006.01)

(52) U.S. Cl. ............................ 385/88; 385/49; 385/70; 385/90; 385/92

(58) Field of Classification Search ........................ None
See application file for complete search history.

(56) References Cited

U.S. PATENT DOCUMENTS

| | | | |
|---|---|---|---|
| 5,917,976 A | 6/1999 | Yamaguchi | |
| 6,517,259 B1 | 2/2003 | Murata | |
| 6,623,178 B1 | 9/2003 | Sakurai et al. | |
| 6,789,956 B2 * | 9/2004 | Iwaki et al. | 385/88 |
| 6,932,519 B2 * | 8/2005 | Steinberg et al. | 385/92 |
| 7,065,275 B2 * | 6/2006 | Miyamae | 385/49 |
| 2004/0028352 A1 | 2/2004 | Sakurai et al. | |
| 2004/0218372 A1 | 11/2004 | Hamasaki et al. | |
| 2005/0063651 A1 | 3/2005 | Hamasaki et al. | |
| 2005/0141824 A1 | 6/2005 | Furuyama et al. | |
| 2005/0156304 A1 | 7/2005 | Furuyama et al. | |
| 2005/0169596 A1 | 8/2005 | Hamasaki et al. | |
| 2005/0230795 A1 | 10/2005 | Furuyama et al. | |
| 2005/0231911 A1 | 10/2005 | Furuyama et al. | |

(Continued)

FOREIGN PATENT DOCUMENTS

CN    1278604 A    1/2001

(Continued)

OTHER PUBLICATIONS

Korean "Office Action" mailed Oct. 12, 2006, issued in counterpart Korean Patent Application No. 2005-0072643.

(Continued)

*Primary Examiner*—Tina M Wong
(74) *Attorney, Agent, or Firm*—Finnegan, Henderson, Farabow, Garrett & Dunner, L.L.P.

(57) ABSTRACT

An optical semiconductor module comprises a guide which has a positioning portion for an optical transmission line, an optical semiconductor mounting surface from which one end face of the optical transmission line disposed in the positioning portion is exposed, and a wiring layer formed on the optical semiconductor mounting surface. An optical semiconductor element is mounted on the optical semiconductor mounting surface of the guide, with a light-emitting surface or a light-receiving surface thereof facing the one end face of the optical transmission line, and is electrically connected to the wiring layer.

20 Claims, 4 Drawing Sheets

U.S. PATENT DOCUMENTS

| | | |
|---|---|---|
| 2006/0038287 A1 | 2/2006 | Hamasaki et al. |
| 2006/0039658 A1 | 2/2006 | Furuyama et al. |

FOREIGN PATENT DOCUMENTS

| | | | |
|---|---|---|---|
| JP | 09021931 A | * | 1/1997 |
| JP | 2000-347072 | | 12/2000 |
| JP | 2001-059923 | | 3/2001 |
| JP | 2001-183546 | | 7/2001 |
| JP | 2002-033546 | | 1/2002 |
| JP | 2004-029225 | | 1/2004 |
| JP | 2004-253456 | | 9/2004 |
| KR | 2003-0088249 | | 11/2003 |

OTHER PUBLICATIONS

Office Action issued by the Chinese Patent Office on May 18, 2007, for Chinese Patent Application No. 2005100877813, and an English-language translation thereof.

Office Action mailed by the Chinese Patent Office on Nov. 2, 2007, for Chinese Patent Application No. 2005100877813.

Office Action mailed by the Japanese Patent Office on Apr. 22, 2008, for Japanese Patent Application No. 2004-233749.

* cited by examiner

OPTICAL SEMICONDUCTOR MODULE AND SEMICONDUCTOR DEVICE INCLUDING THE SAME

CROSS-REFERENCE TO RELATED APPLICATIONS

This application is based upon and claims the benefit of priority from the prior Japanese Patent Application No. 2004-233749, filed on Aug. 10, 2004; the entire contents of which are incorporated herein by reference.

BACKGROUND

1. Field of the Invention

The present invention relates to an optical semiconductor module realizing optical coupling as short-distance optical interconnection with a relatively simple structure and to a semiconductor device including the same.

2. Description of the Related Art

In accordance with the improvement in performance of a bipolar transistor and a field effect transistor, an operating speed of a large-scale integrated circuit (LSI) has been drastically improved. However, even though the speed of an internal operation of the LSI becomes higher, the operating speed of a printed board on which the LSI is mounted is suppressed lower than the speed of the internal operation of the LSI. Moreover, the operating speed on the level of a rack on which the printed board is mounted is suppressed further lower. The reason is because a transmission loss, noise, electromagnetic interference, and the like of electrical wiring increase in accordance with the increase in an operating frequency. The longer wiring is, the lower the operating frequency is suppressed in order to ensure signal quality. Therefore, in a semiconductor device, there is an increasing tendency that amounting technology rather than the operating speed of the LSI itself governs the operating speed of a system.

As a measure to solve such a problem confronting the semiconductor device, the application of an optical interconnection technology of optically connecting LSIs has been considered, and an optical semiconductor module for realizing such optical interconnection has been proposed. The optical interconnection can easily realize several 10 Gbps wiring since it has little frequency dependency such as loss in a frequency range of 100 GHz from a direct current, nor does it have any electromagnetic interference of a wiring path or fluctuating noise of ground potential. In order to realize this type of optical interconnection between the LSIs, an optical semiconductor module with a simple structure is necessary. Further, since the LSI interconnection requires a large number of optical transmission lines, it is important to realize cost reduction of the optical semiconductor module.

Many of typical optical semiconductor modules cannot be greatly downsized since an imaging lens is assembled therein and a connector structure is employed in a coupling portion of optical fibers. On the other hand, an optical semiconductor module described in, for example, Japanese Patent Laid-open Application No. 2000-347072 has an advantage that it can be downsized relatively easily since an optical transmission line such as an optical fiber and an optical semiconductor element are integrated by direct coupling. The optical semiconductor module described in this patent document, however, has the following drawbacks.

Specifically, the optical semiconductor module described in the aforesaid patent document is structured such that the optical fiber and a supporting member thereof are integrated in advance and thereafter an electrode for mounting the optical semiconductor element is formed. Therefore, pattern drawing or pattern transfer of the electrode has to be performed on a very narrow end face of the supporting member holding the optical fiber. That is, patterning with several μm accuracy has to be performed on a minute area of the end face of the supporting member while the several m to several 10 m optical fiber is kept attached thereto. Electrode formation processes including such patterning on the end face of the supporting member lead to a great increase in manufacturing cost, a reduction in manufacturing yield, and the like of the optical semiconductor module.

Further, in order to drive the optical semiconductor element, the typical optical semiconductor module requires a driver element or a receiver element capable of responding to a high-speed signal. The aforesaid patent document does not at all teach a mounting method of these driving elements. For example, depending on a mounting structure of the driving element, there arise problems such as a size increase of the optical semiconductor module and an increase in length of the electrical wiring portion between the optical semiconductor element and the driving element.

SUMMARY

An optical semiconductor module according to one embodiment of the present invention comprises: a guide having a positioning portion for an optical transmission line, an optical semiconductor mounting surface from which one end face of the optical transmission line disposed in the positioning portion is exposed, and a wiring layer formed only on the optical semiconductor mounting surface; and an optical semiconductor element which is mounted on the optical semiconductor mounting surface of the guide with a light-emitting surface or a light-receiving surface thereof facing the one end face of the optical transmission line, and which is electrically connected. to the wiring layer.

An optical semiconductor module according to another embodiment of the present invention comprises: a guide having a positioning portion for an optical transmission line, an optical semiconductor mounting surface from which one end face of the optical transmission line disposed in the positioning portion is exposed, and a wiring layer formed on the optical semiconductor mounting surface, on a surface opposed to the optical semiconductor mounting surface, and in a through hole connecting the both surfaces; and an optical semiconductor element which is mounted on the optical semiconductor mounting surface of the guide with a light-emitting surface or a light-receiving surface thereof facing the one end face of the optical transmission line, and which is electrically connected to the wiring layer.

An optical semiconductor module according to still another embodiment of the present invention comprises: a guide having a plurality of through holes which position optical transmission lines, the adjacent through holes communicating with each other, and an optical semiconductor mounting surface from which one end face of each of the plural optical transmission lines inserted in the plural through holes is exposed; and an optical semiconductor element mounted on the optical semiconductor mounting surface of the guide with a light-emitting surface or a light-receiving surface thereof facing the one end face of each of the plural optical transmission lines.

A semiconductor device according to one embodiment of the present invention comprises: any one of the aforesaid optical semiconductor modules; the optical transmission line disposed in the positioning portion (through hole) of the guide; a substrate on which the optical semiconductor module is mounted and which has a signal line connected to the optical semiconductor module; and a signal-processing semiconductor element mounted on the substrate and connected to the signal line of the substrate.

BRIEF DESCRIPTION OF THE DRAWINGS

The present invention will be described with reference to the drawings, but these drawings are presented only for an illustrative purpose and in no way limit the present invention.

DETAILED DESCRIPTION

Hereinafter, embodiments of the present invention will be described with reference to the drawings. Though the embodiments of the present invention will be described below based on the drawings, these drawings are presented only for an illustrative purpose and are not intended to limit the present invention.

Figure 1:
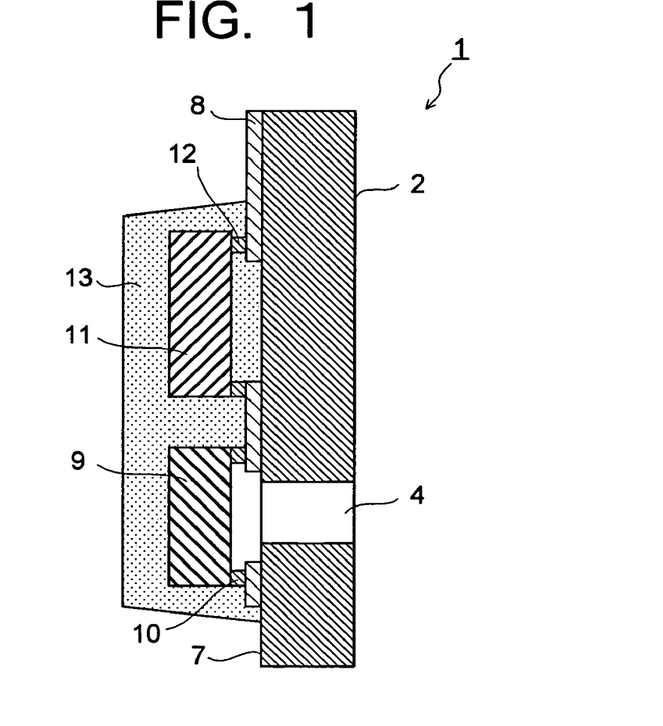
FIG. 1 is a cross-sectional view showing a structure of an optical semiconductor module according to a first embodiment of the present invention.
Figure 2:
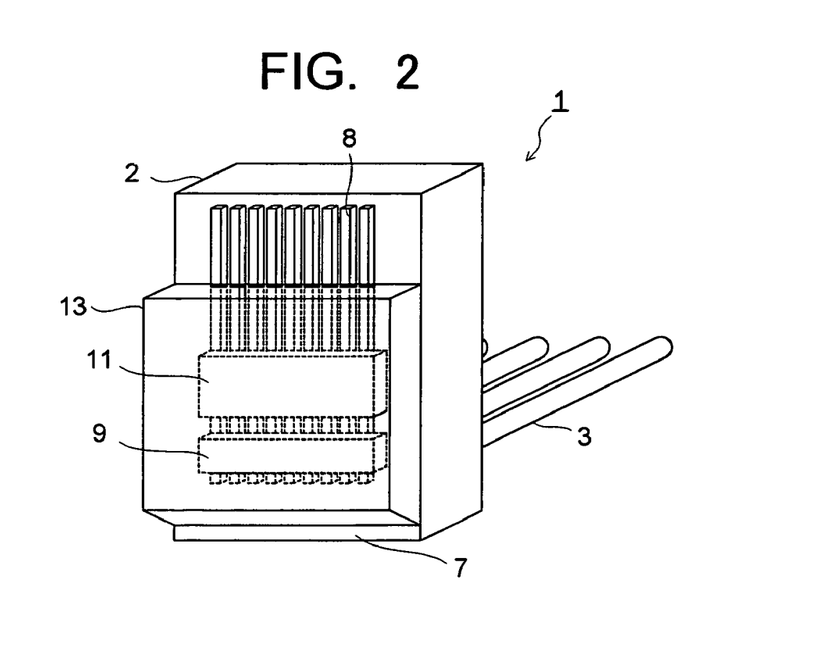
FIG. 2 is a perspective view showing the optical semiconductor module shown in FIG. 1 with optical fibers disposed therein.

FIG. 1 is a cross-sectional view showing a structure of an optical semiconductor module according to a first embodiment of the present invention. FIG. 2 is a perspective view showing the optical semiconductor module shown in FIG. 1 with optical fibers as optical transmission lines disposed therein. The optical semiconductor module 1 shown in these drawings has a guide 2 for positioning the optical transmission lines, for example, optical fibers.

The guide 2 is made of a member of, for example, epoxy resin with a glass filler mixed therein and constitutes a main body of a photoelectric ferrule. Inside the guide 2, through holes 4 for holding optical fibers inserted therein are formed as positioning portions for the optical transmission lines. The positioning through holes 4 are formed in plurality according to the number of the optical fibers 3 used for optical interconnection. Note that FIG. 1 shows the guide 2 used for a 4-channel optical semiconductor element array.

Figure 3:
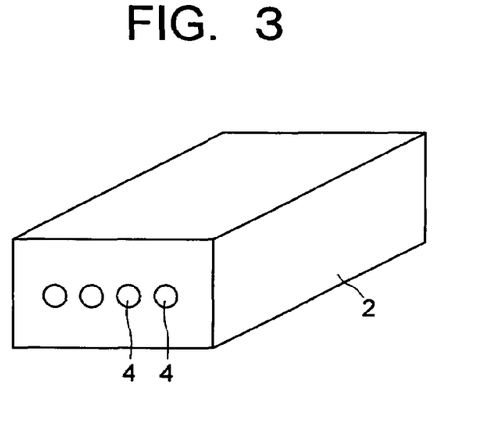
FIG. 3 is a perspective view showing an example of positioning through holes in a guide.
Figure 4:
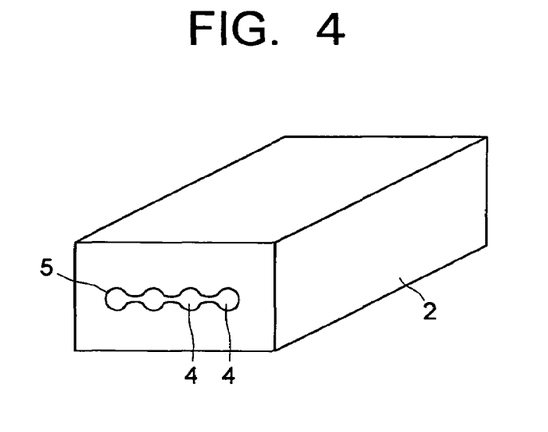
FIG. 4 is a perspective view showing another example of the positioning through holes in the guide.
Figure 5:
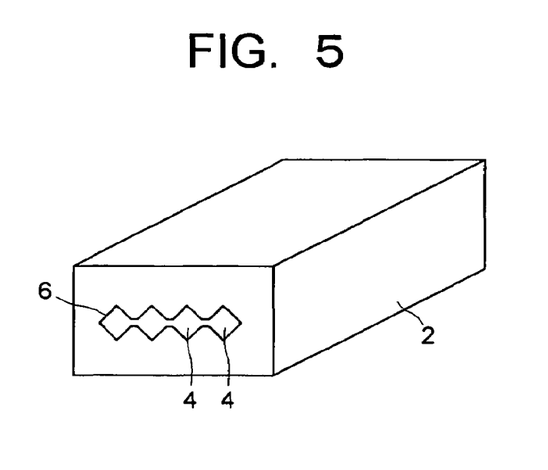
FIG. 5 is a perspective view showing still another example of the positioning through holes in the guide.

The plural positioning through holes 4, 4, . . . are formed in the guide 2 at a predetermined pitch, for example, as shown in FIG. 3. Here, high accuracy is needed in forming the plural positioning through holes 4. Regarding this respect, the plural positioning through holes 4, 4, . . . may be individually formed as shown in FIG. 3, but the plural positioning through holes 4, 4, . . . are preferably formed as a communicating hole 5 or 6, for example, as shown in FIG. 4 or FIG. 5. These structures can easily enhance position accuracy of the plural positioning through holes 4, 4, . . .

Specifically, the guide 2 shown in FIG. 4 has the communicating hole 5 in which the adjacent positioning through holes 4 are made to communicate with each other. The communicating hole 5 is structured such that longitudinal side faces of the adjacent through holes 4 are made to communicate with each other to such an extent to allow the through holes 4 each with a circular cross section to keep holding the optical fibers 3. The guide 2 shown in FIG. 5 has the plural through holes 4, 4, . . . each with a rectangular cross section, and the adjacent through holes 4 are made to communicate with each other, so that the communicating hole 6 is formed. Thus making the adjacent positioning through holes 4 communicate with each other leads to enhanced position accuracy in forming each of the through holes 4. Therefore, it is possible to enhance accuracy in positioning between the optical fibers 3 held by the guide 2 and a later-described optical semiconductor element.

Incidentally, the plural positioning through holes 4 formed in the communicating state are applicable to guides in various shapes. Further, a mounting structure of an optical semiconductor element on the guide 2 is not limited to the structure shown in FIG. 1. The communicating holes 5, 6 are applicable as the positioning through holes of guides in various structures and with various element mounting structures as long as a light-emitting surface or a light-receiving surface of the optical semiconductor element faces the positioning through holes.

A surface of the guide 2 in which one-side opening portions of the positioning through holes 4 are formed is an optical semiconductor mounting surface 7. The optical semiconductor mounting surface 7 is an end side of the optical fibers 3 in terms of an insertion direction thereof. One end face of each of the optical fibers 3 inserted in the positioning through holes 4 is exposed from the optical semiconductor mounting surface 7. A wiring layer 8 formed by, for example, plating is provided on the optical semiconductor mounting surface 7 of the guide 2. Incidentally, instead of the plating wiring layer, a lead frame, a printed wiring board, or the like may be adopted as the wiring layer 8. Each of them is joined to the optical semiconductor mounting surface 7 to be used as electrical wiring.

The wiring layer 8 is formed only on the optical semiconductor mounting surface 7 of the guide 2. Thus forming the wiring layer 8 only on the optical semiconductor mounting surface 7 in advance makes it possible to reduce cost in forming the wiring layer 8 by, for example, plating. In addition, this can enhance accuracy in forming the wiring layer 8. Because of these reasons, it becomes possible to realize manufacturing cost reduction and downsizing of the optical semiconductor module 1.

An optical semiconductor element 9 is mounted on the optical semiconductor mounting surface 7 of the guide 2. The optical semiconductor element 9 mounted on the guide 2 is a light-emitting element such as a LED or a light-receiving element such as a photodiode. Such an optical semiconductor element 9 is fixed to the optical semiconductor mounting surface 7 of the guide 2, being positioned such that a light-emitting surface (if the optical semiconductor element 9 is a light-emitting element) or light-receiving surface (if the optical semiconductor element 9 is a light-receiving element) thereof faces the one end face of each of the optical fibers 3 inserted in the positioning through holes 4.

The positions of the positioning through holes 4 of the guide 2 and the light-emitting surface or the light-receiving surface of the optical semiconductor element 9 are bases of the positioning of the optical semiconductor element 9. Positioning accuracy is roughly 1 μm or less. Bump electrodes 10 provided on the optical semiconductor element 9 are joined to the wiring layer 8, so that the optical semiconductor element 9 is fixed. Such joint by the bump electrodes 10 realizes the electrical connection of the optical semiconductor element 9 to the wiring layers 8 as well as the mechanical fixation thereof to the guide 2. Incidentally, for a higher fixing strength, an entire surface of the optical semiconductor element 9 may be coated with a minute amount of transparent resin.

A driving semiconductor element 11 is further mounted on the optical semiconductor mounting surface 7 of the guide 2 to be adjacent to the optical semiconductor element 9. The driving semiconductor element 11 for the optical semiconductor element 9 is a driver element when the optical semiconductor element 9 is a light-emitting element, and is a receiver element when the optical semiconductor element 9 is a light-receiving element. Joining bump electrodes 12 to the wiring layer 8 realizes the connection and fixation of the driving semiconductor element 11, similarly to the optical semiconductor element 9. The optical semiconductor element 9 and the driving semiconductor element 11 are electrically connected via the wiring layer 8.

The above-described arrangement of the driving semiconductor element 11 adjacent to the optical semiconductor element 9 makes it possible to realize downsizing and cost reduction of the optical semiconductor module 1 while constituent elements necessary for the operation of the optical semiconductor module 1 are mounted therein. In addition, since the distance of the electrical wiring portion handling weak electrical signals is shortened, it is possible to suppress deterioration of signal quality ascribable to the optical semiconductor module 1. Therefore, it is possible to greatly enhance signal reliability while realizing the downsizing, cost reduction, and so on of the optical semiconductor module 1.

The optical semiconductor element 9 and the driving semiconductor element 11 mounted on the optical semiconductor mounting surface 7 of the guide 2 are sealed by insulative sealing resin together with the wiring layer 8. Part of the wiring layer 8 extends to the outside of the sealing resin 13, and portion of the wiring layer 8 exposed from the sealing resin 13 serves as electrodes for connection to other components (external connection electrodes). Note that constituent materials of the insulative sealing resin 13 are adjusted so that it does not spread to a front surface side (light-emitting surface or light-receiving surface side) of the optical semiconductor element 9. These constituent elements constitute the optical semiconductor module 1.

Figure 6:
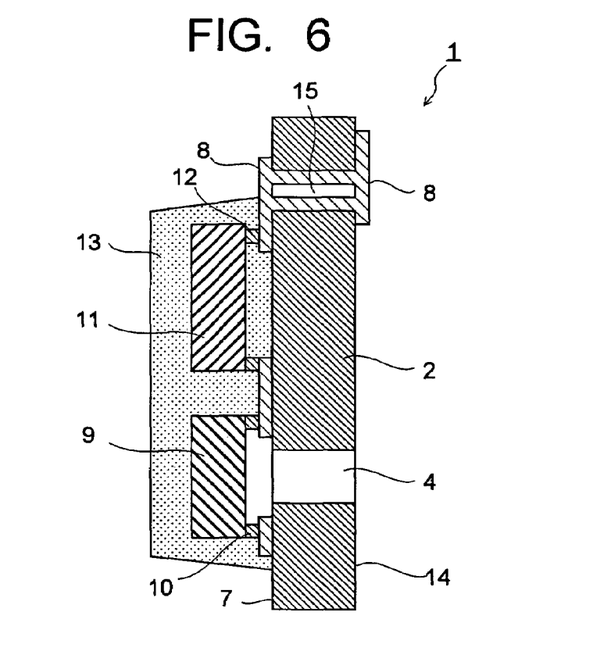
FIG. 6 is a cross-sectional view showing a structure of an optical semiconductor module according to a second embodiment of the present invention.

Here, in FIG. 1, the wiring layer 8 is formed only on the optical semiconductor mounting surface 7 of the guide 2, but the wiring layer 8 may extend to a rear surface side of the guide 2, that is, a surface 14 opposed to the optical semiconductor mounting surface 7, for example, as shown in FIG. 6. FIG. 6 shows a structure of an optical semiconductor module according to a second embodiment of the present invention. In a guide 2 shown in FIG. 6, wiring layers 8 are formed on an optical semiconductor mounting surface 7, on a surface 14 opposed thereto, and in through holes 15 connecting the both surfaces 7, 14. An optical semiconductor element 9 and a driving semiconductor element 11 are sealed by sealing resin 13 together with at least parts of the wiring layers 8 formed on the optical semiconductor mounting surface 7. The wiring layers 8 formed on the surface 14 opposed to the optical semiconductor mounting surface 7 function as electrodes for connection to other components (external connection electrodes).

Adopting such wiring layers 8 makes it possible to relax restriction on the direction for connection to the other components. Further, the wiring layers 8 are formed on the surfaces 7, 14 and in the through holes 15, so that increase in cost necessary for forming the wiring layers 8 can be suppressed. Note that in the optical semiconductor module according to the second embodiment, the communicating hole 5 or 6 shown in FIG. 4 or FIG. 5 in which the adjacent through holes 4 are made to communicate with each other also functions effectively as the positioning through holes 4.

The optical semiconductor module 1 has the optical fibers 3 inserted and fixed in the positioning through holes 4, 4, . . . of the guide 2 respectively as shown in FIG. 2 and is used as an optical interface module. Here, tips of the optical fibers 3 are preferably fixed by bonding while abutting on the transparent resin provided on, for example, a light-emitting surface or a light-receiving surface of the optical semiconductor element 9. The transparent resin may be formed by a resin sheet disposed in advance or may be formed by injected resin. A constituent material of the transparent resin is not limited to a specific one, and a protective film of the semiconductor element may be used instead if it has a certain degree of transparency.

The optical semiconductor module 1 described above is fabricated, for example, in the following manner. First, the guide 2 having the plural positioning through holes 4 is formed by injection molding or the like. Here, the individual guides 2 may be fabricated separately, but it is preferable to, for example, integrally form the plural guides 2 while they are coupled together by a frame. Further, the plural guides 2 are preferably integrated while being arranged in order with the optical semiconductor mounting surfaces 7 facing upwards. A component in which the plural guides 2 are thus integrated is easy to handle in existing semiconductor manufacturing processes, so that productivity of the optical semiconductor module 1 can be enhanced.

Using such an integration-type component described above, the wiring layers 8 are formed by plating the optical semiconductor mounting surface 7 of each of the guides 2. When the guide 2 shown in FIG. 6 is fabricated, the wiring layers 8 are formed on the optical semiconductor mounting surface 7, on the surface 14 opposed thereto, and in the through holes 15. Next, the optical semiconductor element 9 and the driving semiconductor element 11 are mounted on the optical semiconductor mounting surface 7 of the guide 2. These elements 9, 11 are fixed by using bump electrodes 10, 12. Thereafter, the optical semiconductor element 9 and the driving semiconductor element 11 are insulatingly sealed by the sealing resin 13. After a series of such manufacturing processes is finished, both ends of the guides 2 are separated from the frame, so that the optical semiconductor module 1 is finished.

In the optical semiconductor module 1 of the above-described embodiments, the driving semiconductor element 11 such as the driver element driving the light-emitting optical semiconductor element 9 or the receiver element driving the light-receiving optical semiconductor element 9 is mounted, being adjacent to the optical semiconductor element. Therefore, wiring in an analog circuit portion handling very weak electrical signals is shortened, enabling a great reduction in deterioration of signal quality. Moreover, the optical semiconductor module 1 having such a driving semiconductor element 11 therein can be downsized. Further, it is possible to realize, in addition to the downsizing of the optical semiconductor module 1, cost reduction of the optical semiconductor module 1 since the electrical wiring is constituted by the wiring layers 8 formed only on the optical semiconductor mounting surface or by the wiring layers 8 formed on the optical semiconductor mounting surface 7, on the surface 14 opposed thereto, and in the through holes 15 connecting these surfaces 7, 14.

Figure 7:
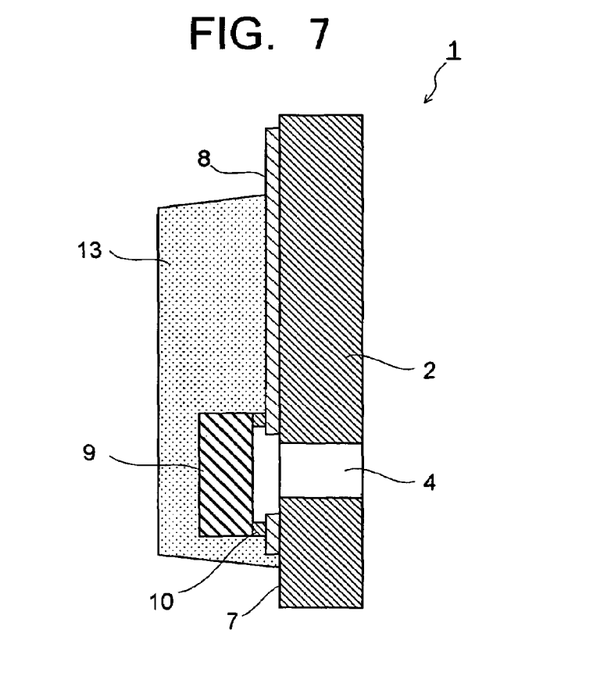
FIG. 7 is a cross-sectional view showing an optical semiconductor module according to a third embodiment of the present invention.

The above-described embodiments have described the optical semiconductor module 1 in which the driving semiconductor element 11 is mounted, but it should be noted that the structure of the optical semiconductor module of the present invention is not limited to such a structure. When the driving semiconductor element is disposed on a connected component side, only the optical semiconductor element 9 is mounted on the guide 2, for example, as shown in FIG. 7. FIG. 7 shows a structure of an optical semiconductor module according to a third embodiment-of the present invention. This structure can also realize the downsizing and cost reduction of the optical semiconductor module 1 in which the optical semiconductor element 9 is mounted.

Figure 8:
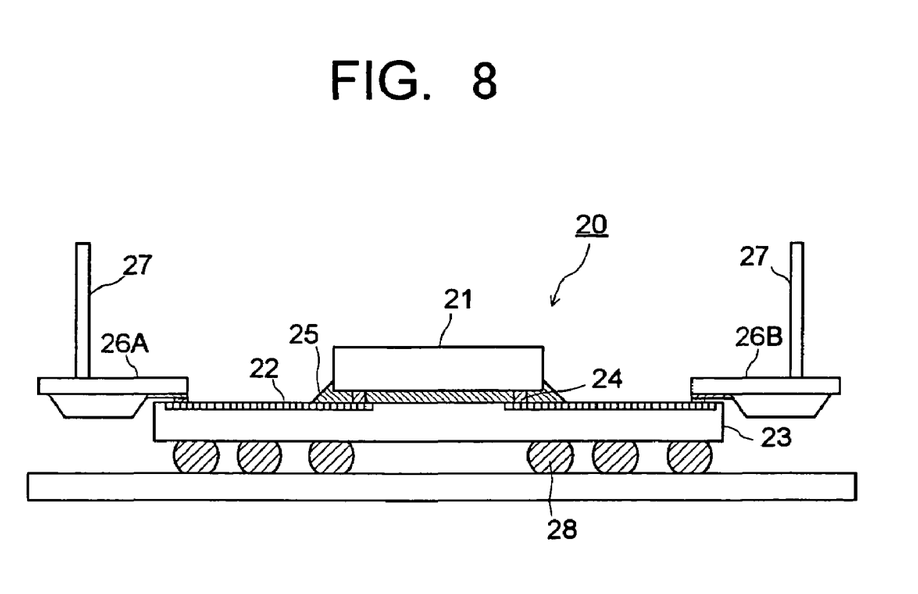
FIG. 8 is a cross-sectional view showing a rough structure of a semiconductor device according to one embodiment of the present invention.

Next, one embodiment of a semiconductor device to which the optical semiconductor module of the present invention is applied will be described with reference to FIG. 8. A semiconductor device 20 shown in FIG. 8 has a signal-processing LSI 21. The signal-processing LSI 21 is flipchip-bonded via bump electrodes 24 to a substrate 23 having high-speed signal lines 22. An underfill resin 25 is filled between the signal-processing LSI 21 and the substrate 23. Optical semiconductor modules 26 (1) having the structure shown in any of the aforesaid embodiments are mounted on the substrate 23 on which the signal-processing LSI 21 is mounted.

The optical semiconductor modules 26 are connected to and fixed on the substrate 23 so that driving semiconductor elements provided therein are electrically connected to the high-speed signal lines 22. In the optical semiconductor modules 26, portions of wiring layers exposed from sealing resin are electrically connected to the high-speed signal lines 22. The semiconductor device 20 of this embodiment has a first optical semiconductor module 26a in which a light-emitting optical semiconductor element and a driver element are mounted, and a second optical semiconductor module 26B in which a light-receiving optical semiconductor element and a receiver element are mounted. Optical fibers 27a reconnected to these optical semiconductor modules 26a, 26B respectively. The substrate 23 has wiring layers, though not shown, constituting a power source, a grounding line, and a low-speed control signal line 27, and the wiring layers are connected to bump electrodes 28 formed on an underside of the substrate 23.

Figure 9:
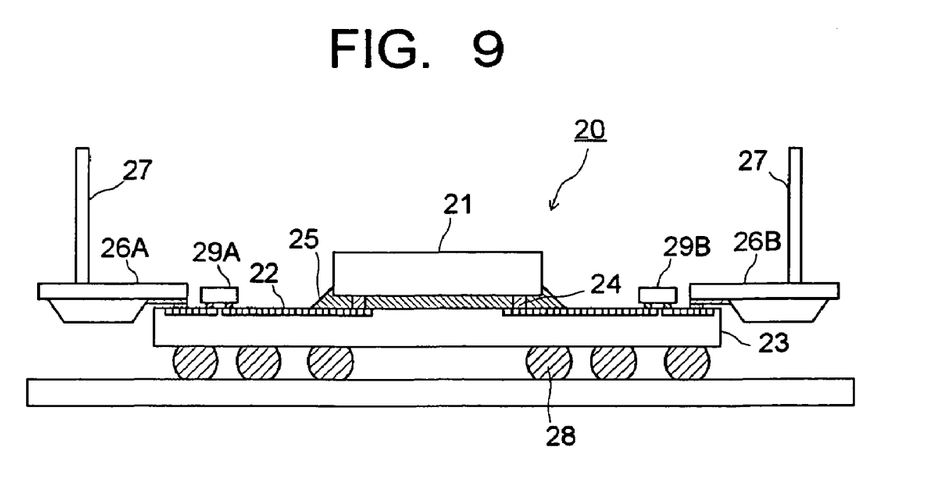
FIG. 9 is a cross-sectional view showing a rough structure of a semiconductor device according to another embodiment of the present invention.

When the optical semiconductor module as shown in FIG. 7 is used, a substrate 23 having driving semiconductor elements 29 mounted thereon is adopted as shown in FIG. 9. The substrate 23 has a driver element 28a and a receiver element 29B as the driving semiconductor elements. These driver element 28a and receiver element 29B are connected to signal lines 22 respectively. The first optical semiconductor module 26a having the light-emitting optical semiconductor element therein is connected to the driver element 28a. The second optical semiconductor module 26B having the light-receiving optical semiconductor element therein is connected to the receiver element 29B.

According to the semiconductor device 20 of the above-described embodiment, the optical semiconductor module 26 with a simple structure is adopted for optical coupling, so that it is possible to realize at low cost a wiring structure in which optical interconnection is adopted for LSI interconnection. This greatly contributes to cost reduction of wiring between high-speed chips. Therefore, it is possible to realize advancement, higher performance, and the like of information and communication devices and the like. It should be noted that the intended use of the optical semiconductor module of the present invention is not limited to the LSI interconnection, but it is applicable to various kinds of short-distance optical transmission.

It should be noted that the present invention is not limited to the embodiments described above, and it can be embodied in various modified forms, without departing from the sprit of the present invention. Moreover the embodiments can be appropriately combined to an allowable extent when the present invention is embodied, which can provide combined effects. Further, the above-described embodiments include inventions on various stages, and by appropriately combining these inventions under a plurality of features that are disclosed, various inventions can be extracted therefrom.

What is claimed is:

1. An optical semiconductor module, comprising:
   a guide having a positioning portion for an optical transmission line and directly supporting the optical transmission line, the optical transmission line extending completely through the guide, an optical semiconductor mounting surface from which one end face of the optical transmission line disposed in the positioning portion is exposed, an opposing surface opposing the optical semiconductor mounting surface, and a wiring layer formed only on the optical semiconductor mounting surface, the positioning portion having a substantially uniform size between the optical semiconductor mounting surface and the opposing surface; and
   an optical semiconductor element mounted on the optical semiconductor mounting surface of the guide with a light-emitting surface or a light-receiving surface to face the one end face of the optical transmission line, and electrically connected to the wiring layer.

2. The optical semiconductor module as set forth in claim 1, further comprising:
   a driving semiconductor element mounted on the optical semiconductor mounting surface of the guide and electrically connected to the wiring layer to drive the optical semiconductor element.

3. The optical semiconductor module as set forth in claim 2, wherein the optical semiconductor element and the driving semiconductor element are sealed together with part of the wiring layer by a sealing resin, and a portion of the wiring layer exposed from the sealing resin functions as an external connection electrode.

4. An optical semiconductor module, comprising:
   a guide having a positioning portion for an optical transmission line and directly supporting the optical transmission line, the optical transmission line extending completely through the guide, an optical semiconductor mounting surface from which one end face of the optical transmission line disposed in the positioning portion is exposed, an opposing surface opposing the optical semiconductor mounting surface, and a wiring layer formed on the optical semiconductor mounting surface, on the opposing surface, and in a through hole connecting both the mounting and opposing surfaces, the positioning portion having a substantially uniform size between the mounting surface and the opposing surface; and
   an optical semiconductor element mounted on the optical semiconductor mounting surface of the guide with a light-emitting surface or a light-receiving surface to face the one end face of the optical transmission line, and electrically connected to the wiring layer.

5. The optical semiconductor module as set forth in claim 4, further comprising:
a driving semiconductor element mounted on the optical semiconductor mounting surface of the guide and electrically connected to the wiring layer to drive the optical semiconductor element.

6. The optical semiconductor module as set forth in claim 5, wherein the optical semiconductor element and the driving semiconductor element are sealed together with at least a part of the wiring layer formed on the optical semiconductor mounting surface by a sealing resin, and the wiring layer formed on the surface opposing the optical semiconductor mounting surface functions as an external connection electrode.

7. An optical semiconductor module, comprising:
a guide having a plurality of through holes to position plural optical transmission lines, adjacent ones of the through holes directly communicating with each other, and an optical semiconductor mounting surface from which one end face of each of the plural optical transmission lines inserted in the plural through holes is exposed; and
an optical semiconductor element mounted on the optical semiconductor mounting surface of the guide with a light-emitting surface or a light-receiving surface to face the one end face of each of the plural optical transmission lines.

8. The optical semiconductor module as set forth in claim 7, further comprising:
a driving semiconductor element mounted on the optical semiconductor mounting surface of the guide to drive the optical semiconductor element.

9. The optical semiconductor module as set forth in claim 8, wherein the guide has a wiring layer formed only on the optical semiconductor mounting surface, and the optical semiconductor element and the driving semiconductor element are electrically connected to the wiring layer.

10. The optical semiconductor module as set forth in claim 9, wherein the optical semiconductor element and the driving semiconductor element are sealed together with part of the wiring layer by a sealing resin, and a portion of the wiring layer exposed from the sealing resin functions as an external connection electrode.

11. The optical semiconductor module as set forth in claim 8, wherein the guide has a wiring layer formed on the optical semiconductor mounting surface, on a surface opposing the optical semiconductor mounting surface, and in a through hole connecting both the mounting and opposing surfaces, and the optical semiconductor element and the driving semiconductor element are electrically connected to the wiring layer formed on the optical semiconductor mounting surface.

12. The optical semiconductor module as set forth in claim 11, wherein the optical semiconductor element and the driving semiconductor element are sealed together with at least a part of the wiring layer formed on the optical semiconductor mounting surface by a sealing resin, and the wiring layer formed on the surface opposing the optical semiconductor mounting surface functions as an external connection electrode.

13. A semiconductor device, comprising:
an optical semiconductor module comprising a guide having a positioning portion for an optical transmission line and directly supporting the optical transmission line, the optical transmission line extending completely through the guide, an optical semiconductor mounting surface from which one end face of the optical transmission line disposed in the positioning portion of the guide is exposed, an opposing surface opposing the optical semiconductor mounting surface, and a wiring layer formed only on the optical semiconductor mounting surface, the positioning portion having a substantially uniform size between the optical semiconductor mounting surface and the opposing surface;
an optical semiconductor element mounted on the optical semiconductor mounting surface of the guide with a light-emitting surface or a light-receiving surface to face the one end face of the optical transmission line, and electrically connected to the wiring layer;
a substrate on which the optical semiconductor module is mounted and which has a signal line connected to the optical semiconductor module; and
a signal-processing semiconductor element mounted on the substrate and connected to the signal line of the substrate.

14. The semiconductor device as set forth in claim 13, wherein the optical semiconductor module further comprises a driving semiconductor element mounted on the optical semiconductor mounting surface of the guide and electrically connected to the wiring layer to drive the optical semiconductor element.

15. A semiconductor device, comprising:
an optical semiconductor module comprising a guide having a positioning portion for an optical transmission line and directly supporting the optical transmission line, the optical transmission line extending completely through the guide, an optical semiconductor mounting surface from which one end face of the optical transmission line disposed in the positioning portion of the guide is exposed, an opposing surface opposing the optical semiconductor mounting surface, and a wiring layer formed on the optical semiconductor mounting surface, on the opposing surface, and in a through hole connecting both the mounting and opposing surfaces, the positioning portion having a substantially uniform size between the mounting surface and the opposing surface;
an optical semiconductor element mounted on the optical semiconductor mounting surface of the guide with a light-emitting surface or a light-receiving surface to face the one and face of the optical transmission line, and electrically connected to the wiring layer;
a substrate on which the optical semiconductor module is mounted and which has a signal line connected to the optical semiconductor module; and
a signal-processing semiconductor element mounted on the substrate and connected to the signal line of the substrate.

16. The semiconductor device as set forth in claim 15, wherein the optical semiconductor module further comprises a driving semiconductor element mounted on the optical semiconductor mounting surface of the guide and electrically connected to the wiring layer to drive the optical semiconductor element.

17. A semiconductor device, comprising:
an optical semiconductor module comprising a guide having a plurality of through holes to position plural optical transmission lines, adjacent ones of the through holes directly communicating with each other, and an optical semiconductor mounting surface from which one end face of each of the optical transmission lines inserted in the plurality of through holes is exposed;
an optical semiconductor element mounted on the optical semiconductor mounting surface of the guide with a light-emitting surface or a light-receiving surface to face the one end face of each of the plural optical transmission lines;

a substrate on which the optical semiconductor module is mounted and which has a signal line connected to the optical semiconductor module; and a signal-processing semiconductor element mounted on the substrate and connected to the signal line of the substrate.

18. The semiconductor device as set forth in claim 17, wherein the optical semiconductor module further comprises a driving semiconductor element mounted on the optical semiconductor mounting surface of the guide to drive the optical semiconductor element.

19. The semiconductor device as set forth in claim 18, wherein the guide has a wiring layer formed only on the optical semiconductor mounting surface, and the optical semiconductor element and the driving semiconductor element are electrically connected to the wiring layer.

20. The semiconductor device as set forth in claim 17, wherein a driving semiconductor element driving the optical semiconductor element is mounted on the substrate, and the driving semiconductor element is connected to the signal line of the substrate.

* * * * *

UNITED STATES PATENT AND TRADEMARK OFFICE
CERTIFICATE OF CORRECTION

PATENT NO.       : 7,438,481 B2
APPLICATION NO.  : 11/200045
DATED            : October 21, 2008
INVENTOR(S)      : Numata et al.

Page 1 of 1

It is certified that error appears in the above-identified patent and that said Letters Patent is hereby corrected as shown below:

Claim 15, column 10, line 43, change "one and face" to --one end face--.

Signed and Sealed this

Twentieth Day of January, 2009

JON W. DUDAS
*Director of the United States Patent and Trademark Office*